(12) United States Patent
Kawano

(10) Patent No.: US 10,366,880 B2
(45) Date of Patent: Jul. 30, 2019

(54) SEMICONDUCTOR DEVICE AND METHOD OF MANUFACTURING SEMICONDUCTOR DEVICE

(71) Applicant: FUJI ELECTRIC CO., LTD., Kawasaki-shi, Kanagawa (JP)

(72) Inventor: Shinichi Kawano, Matsumoto (JP)

(73) Assignee: FUJI ELECTRIC CO., LTD., Kawasaki-shi, Kanagawa (JP)

( * ) Notice: Subject to any disclaimer, the term of this patent is extended or adjusted under 35 U.S.C. 154(b) by 38 days.

(21) Appl. No.: 15/854,509

(22) Filed: Dec. 26, 2017

(65) Prior Publication Data

US 2018/0197729 A1 Jul. 12, 2018

(30) Foreign Application Priority Data

Jan. 6, 2017 (JP) ................................ 2017-001388
Sep. 13, 2017 (JP) ................................ 2017-176094

(51) Int. Cl.
| | |
|---|---|
| *H01L 29/66* | (2006.01) |
| *H01L 29/40* | (2006.01) |
| *H01L 21/336* | (2006.01) |
| *H01L 21/02* | (2006.01) |
| *H01L 21/283* | (2006.01) |

(Continued)

(52) U.S. Cl.
CPC ........ *H01L 21/022* (2013.01); *H01L 21/0231* (2013.01); *H01L 21/02118* (2013.01); *H01L 21/02288* (2013.01); *H01L 21/283* (2013.01); *H01L 21/56* (2013.01); *H01L 23/293* (2013.01);

(Continued)

(58) Field of Classification Search
CPC ............ H01L 21/022; H01L 21/02118; H01L 21/02288; H01L 21/0231; H01L 21/283; H01L 21/56; H01L 23/293; H01L 23/3171; H01L 23/4824; H01L 29/41725; H01L 2924/35121
USPC ................ 257/331, 341, 737, 738, E21.418; 438/127, 268
See application file for complete search history.

(56) References Cited

U.S. PATENT DOCUMENTS

| 4,349,609 A * | 9/1982 | Takeda ................ H01L 23/5329 |
| | | 216/22 |
| 2017/0062361 A1* | 3/2017 | Yajima .................... H01L 24/02 |
| 2017/0352604 A1* | 12/2017 | Hirao .................... H01L 23/296 |

FOREIGN PATENT DOCUMENTS

| JP | H06-151861 A | 5/1994 |
| JP | H09-69591 A | 3/1997 |

(Continued)

*Primary Examiner* — Mohammed Shamsuzzaman
*Assistant Examiner* — Aaron J Gray
(74) *Attorney, Agent, or Firm* — Rabin & Berdo, P.C.

(57) ABSTRACT

A second protective film is formed by applying high-viscosity resin by an inkjet method, in two patterns that extend parallel to and along a boundary between a first protective film and a plating film, the boundary being sandwiched between the two patterns. A low-viscosity resin is applied between these first and second patterns of the second protective film by the inkjet method. The low-viscosity resin has a viscosity that is lower than that of the high-viscosity resin for forming the second protective film, and a fluidity that is higher than that of the high-viscosity resin and thus, leaks and spreads into a gap between the first protective film and the plating film. The third protective film adheres to the first and second patterns, is formed across the boundary between the first protective film and the plating film, and is embedded in the gap whereby the gap is plugged.

13 Claims, 13 Drawing Sheets

(51) Int. Cl.
    *H01L 23/31*     (2006.01)
    *H01L 21/56*     (2006.01)
    *H01L 23/29*     (2006.01)
    *H01L 29/417*     (2006.01)
    *H01L 23/482*     (2006.01)

(52) U.S. Cl.
    CPC ...... *H01L 23/3171* (2013.01); *H01L 23/4824* (2013.01); *H01L 29/41725* (2013.01)

(56) References Cited

FOREIGN PATENT DOCUMENTS

| JP | 2003-126760 A | 5/2003 |
| JP | 2009-049339 A | 3/2009 |

* cited by examiner

SEMICONDUCTOR DEVICE AND METHOD OF MANUFACTURING SEMICONDUCTOR DEVICE

CROSS REFERENCE TO RELATED APPLICATIONS

This application is based upon and claims the benefit of priority of the prior Japanese Patent Application Nos. 2017-001388 filed on Jan. 6, 2017, and 2017-176094 filed on Sep. 13, 2017, the entire contents of which are incorporated herein by reference.

BACKGROUND OF THE INVENTION

1. Field of the Invention

Embodiments of the invention relate to a semiconductor device and a method of manufacturing a semiconductor device.

2. Description of the Related Art

Conventionally, a passivation film is provided on a front surface of a semiconductor chip as a protective film to protect the semiconductor chip. Commonly known methods of forming this passivation film include the use of a polyimide as a material and application of the polyimide by spin coating, an inkjet method, etc. With spin coating, after the passivation film is formed on the entire front surface of the semiconductor wafer, the passivation film is patterned to have a predetermined pattern. With an inkjet method, since a predetermined amount of the polyimide may be discharged onto the front surface of the semiconductor wafer at a predetermined location, a passivation film of a predetermined pattern is formed without performing patterning.

According to a method proposed as a method of applying a polyimide, after a barrier of a high-viscosity polyimide is formed along an outer edge portion of a main surface of a semiconductor wafer, a low-viscosity polyimide flows into a region surrounded by the barrier (within the barrier) whereby a polyimide film covering the main surface of the semiconductor wafer is formed (e.g., refer to Japanese Laid-Open Patent Publication No. 2009-049339 (paragraphs 0024 to 0029, FIG. 1)). In Japanese Laid-Open Patent Publication No. 2009-049339, since the barrier on the semiconductor wafer functions as a wall to retain the low-viscosity polyimide in the region surrounded by the barrier and low viscosity material flows in so as to form a constant thickness, a thick uniform coating film is formed on the semiconductor wafer.

According to another method proposed as a method of applying a polyimide, after a dam for preventing the flow of sealing resin is formed by a high-viscosity polyimide so as to draw loci along a periphery of a semiconductor chip, a low-viscosity polyimide is formed as a sealing resin inside the dam (e.g., refer to Japanese Laid-Open Patent Publication No. H09-069591 (paragraphs 0015 to 0019, FIG. 1)). In Japanese Laid-Open Patent Publication No. H09-069591, the viscosity of the high-viscosity polyimide is set to 1500 poise to 3000 poise ($\approx$150 Pa·s to 300 Pa·s) and the viscosity of the low-viscosity polyimide is set to be 100 poise to 500 poise ($\approx$10 Pa·s to 50 Pa·s).

According to yet another method proposed as a method of applying a polyimide, a low-viscosity polyimide having a viscosity of 100 cp ($\approx$0.1 Pa·s) is dropped from a dispenser or micro-syringe one drop at a time to fill a through-hole spanning from on a gate pad electrode to on a source electrode with a polyimide resin (e.g., refer to Japanese Laid-Open Patent Publication No. H06-151861 (paragraph 0012)). According to a method proposed as a method of applying a coating solution, a high-viscosity photoresist is discharged along an outer edge portion of a main surface of a semiconductor wafer by an inkjet method to form a barrier and thereafter, a low-viscosity photoresist is discharged inside the barrier by an inkjet method (e.g., Japanese Laid-Open Patent Publication No. 2003-126760 (paragraphs 0006, 0027, 0031, FIG. 4)).

A conventional method of manufacturing a semiconductor device will be described. FIG. 9 is a flowchart depicting an outline of a part of a conventional method of manufacturing a semiconductor device. FIG. 10 is a cross-sectional view of main parts of a conventional semiconductor device. After semiconductor regions of predetermined device structures of semiconductor elements are formed on a semiconductor wafer, a front electrode is formed on the front surface of the semiconductor wafer. In FIG. 10, the semiconductor wafer and the front electrode are depicted collectively as a single layer 110. Next, a polyimide is applied to the front surface of the semiconductor wafer by spin coating thereby forming, as a passivation film, a polyimide film (hereinafter, first protective film) 101 on the entire front surface of the semiconductor wafer so as to cover the front electrode (step S101).

Next, a photoresist film (not depicted) having an opening corresponding to a formation region of a contact (electrical contact portion) with metal wiring is formed on a surface of the first protective film 101 by photolithography and etching. Etching is performed using the photoresist film as a mask to form a contact hole 101a in the first protective film 101 and partially expose the front electrode in the contact hole 101a (step S102). The photoresist film used as the etching mask is removed. Next, conversion of the first protective film 101 into an imide (hardening) is completed by heat treatment (step S103). A plating film 111 is formed on the front electrode exposed in the contact hole 101a (step S104).

Annealing in a nitrogen ($N_2$) atmosphere is performed and surface absorbate on the surface of the semiconductor wafer is removed (step S105). Next, a polyimide is applied by an inkjet method, forming as a passivation film, a polyimide film (hereinafter, second protective film) 102 that covers a boundary of the first protective film 101 and the plating film 111 (step S106). A width w102 of the second protective film 102 is about 200 μm to 300 μm. Next, the second protective film 102 is converted into an imide by heat treatment (step S107), and the semiconductor wafer is diced in individual chips (step S108). Subsequently, a metal wire is soldered to the plating film 111 and thereafter, testing of the electrical characteristics and reliability is performed whereby non-defective chips are separated out (step S109), completing the manufacture of the semiconductor device chips.

SUMMARY OF THE INVENTION

According to one embodiment of the present invention, a method of manufacturing a semiconductor device includes forming a semiconductor device on a semiconductor wafer; forming an electrode layer on a first main surface of the semiconductor wafer, the electrode layer being electrically connected to the semiconductor device; forming a first protective film on the first main surface of the semiconductor wafer, the first protective film containing a first resin and having an opening that partially exposes the electrode layer;

forming an electrode film on a surface of the electrode layer exposed in the opening; selectively applying a second resin on surfaces of the first protective film and the electrode film by an inkjet method so as to form, along a boundary between the first protective film and the electrode film, two second protective films that extend parallel to and sandwich the boundary; and applying a third resin between the two second protective films by the inkjet method so as to form a third protective film in contact with the two second protective films, a viscosity of the third resin being lower than that of the second resin.

In the embodiment, the third resin is embedded in a gap between the first protective film and the electrode film so as to plug the gap, the gap being formed by heat treatment performed prior to applying the third resin.

In the embodiment, the third resin is applied between the two second protective films two or more times so as to plug the gap.

In the embodiment, of the two second protective films, a first second-protective-film is formed on the electrode film, along a contour of the electrode film, and a second second-protective-film is formed on the first protective film, along the contour of the electrode film.

In the embodiment, a thickness of the first second-protective-film formed on the electrode film is thicker than a thickness of the second second-protective-film formed on the first protective film.

In the embodiment, a viscosity of the second resin is 25 mPa·s or higher.

In the embodiment, the viscosity of the third resin is lower than 25 mPa·s.

In the embodiment, the second resin is a polyimide or polybenzoxazole.

In the embodiment, the third resin is a polyimide or polybenzoxazole.

The method according to the embodiment includes removing organic matter on the surfaces of the first protective film and the electrode film after forming the electrode film and before applying the second resin.

In the embodiment, the organic matter is removed by breaking bonds of the organic matter and converting the organic matter into a volatile substance.

In the embodiment, the organic matter is removed by replacing the organic matter with a functional group.

In the embodiment, the organic matter is removed by ultraviolet light irradiation in an oxygen atmosphere.

According to another embodiment of the present invention, a semiconductor device includes a semiconductor element provided on a semiconductor substrate; an electrode layer provided on a first main surface of the semiconductor substrate and electrically connected to the semiconductor element; a first protective film provided on the first main surface of the semiconductor substrate, the first protective film having an opening that partially exposes the electrode layer; an electrode film provided on a surface of the electrode layer exposed in the opening; two second protective films selectively provided in a predetermined pattern on surfaces of the first protective film and the electrode film, the two second protective films extending parallel to and along a boundary between the first protective film and the electrode film, the two second protective films sandwiching the boundary therebetween; and a third protective film provided between the two second protective films, third protective film being in contact with the two second protective films.

In the embodiment, the third protective film is embedded in a gap between the first protective film and the electrode film so as to plug the gap.

In the embodiment, of the two second protective films, a first second-protective-film is provided on the electrode film, along a contour of the electrode film, and a second second-protective-film is formed on the first protective film, along the contour of the electrode film.

In the embodiment, a thickness of the first second-protective-film on the electrode film is thicker than a thickness of the second second-protective-film on the first protective film.

In the embodiment, a thickness of the third protective film from the surfaces of the first protective film and the electrode film is equal to a thickness of the two second protective films or less.

In the embodiment, the two second protective films contain a polyimide or polybenzoxazole.

In the embodiment, the third protective film contains a polyimide or polybenzoxazole.

Objects, features, and advantages of the present invention are specifically set forth in or will become apparent from the following detailed description of the invention when read in conjunction with the accompanying drawings.

DETAILED DESCRIPTION OF THE INVENTION

In semiconductor devices produced (manufactured) by the conventional methods of manufacturing a semiconductor device, a gap 112 is formed between the first protective film 101 and the plating film 111 in the heat treatment performed after formation of the plating film 111 (step S105), at the time of testing the semiconductor devices (step S108) and during actual operation. The gap 112 forms due to the differing thermal expansion coefficients of the first protective film 101 and the plating film 111, and a width w101 thereof becomes a maximum of about 5 μm.

Figure 8:
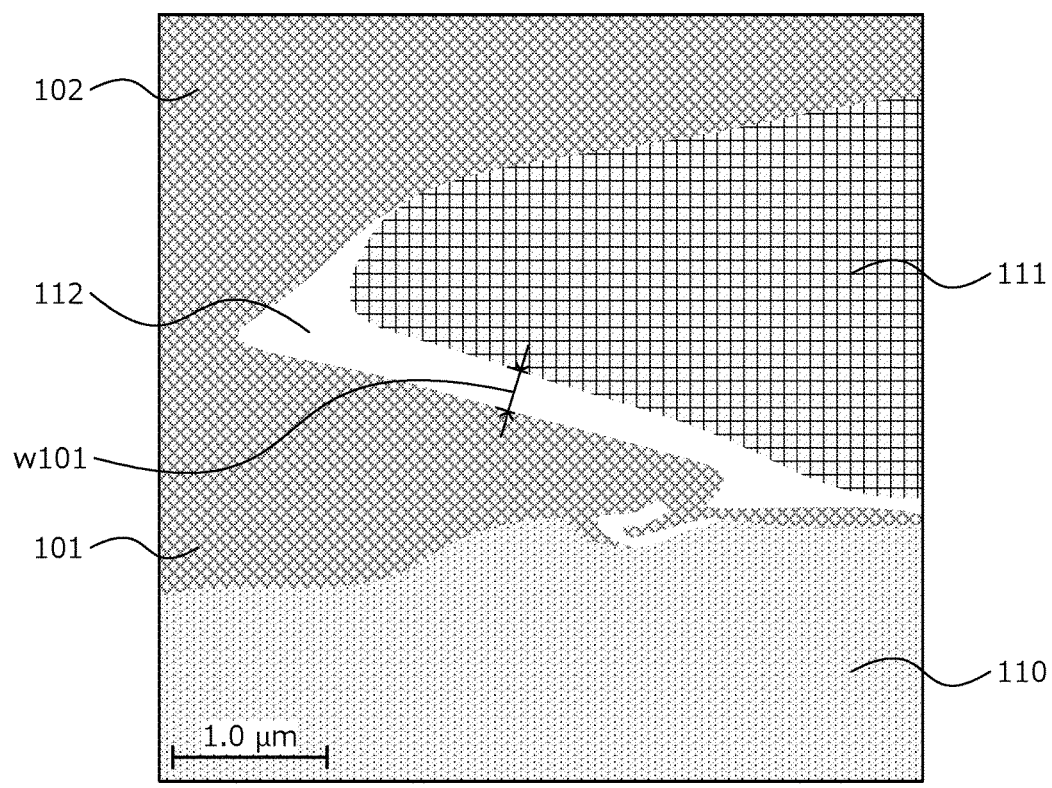
FIG. 8 is a cross-sectional schematic view of a gap between a first protective film and a plating film when observed under a microscope.
Figure 9:
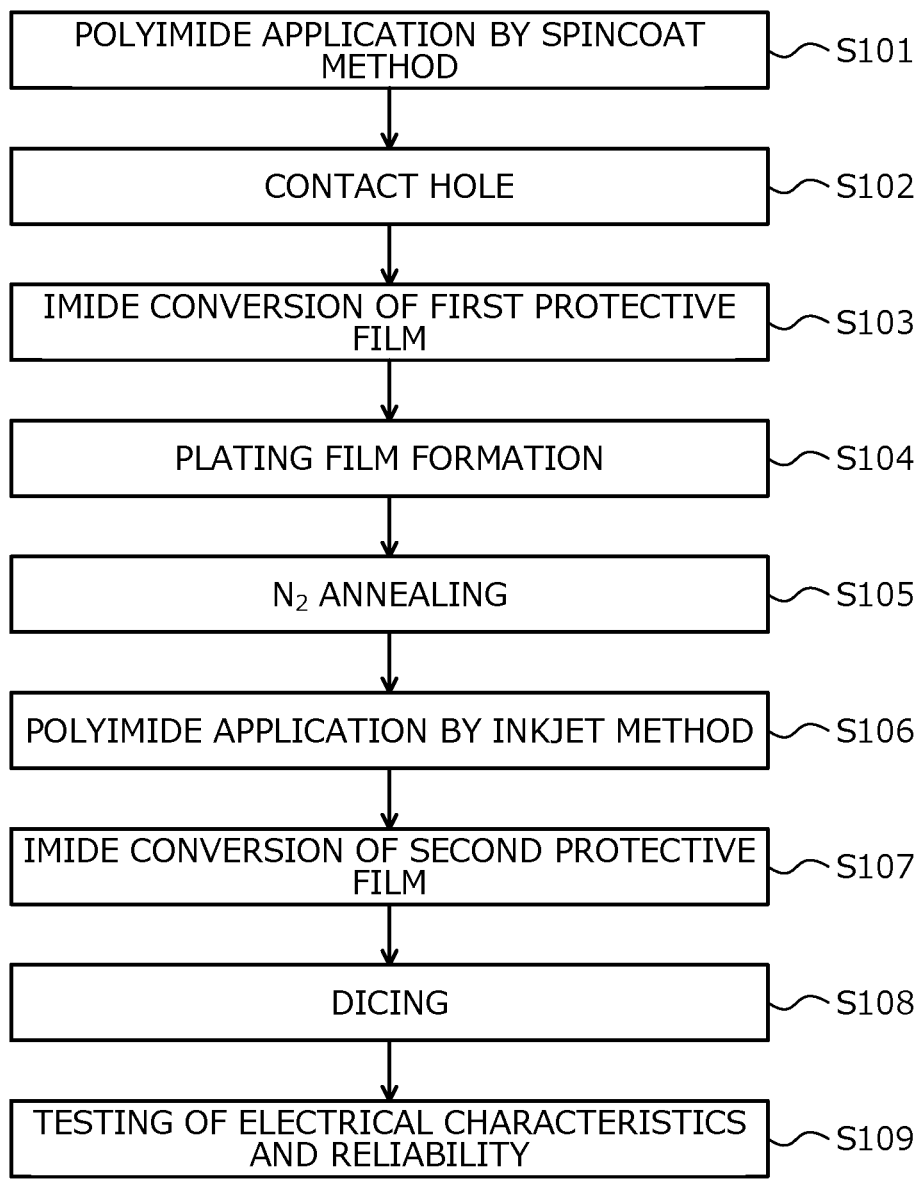
FIG. 9 is a flowchart depicting an outline of a part of a conventional method of manufacturing a semiconductor device.
Figure 10:
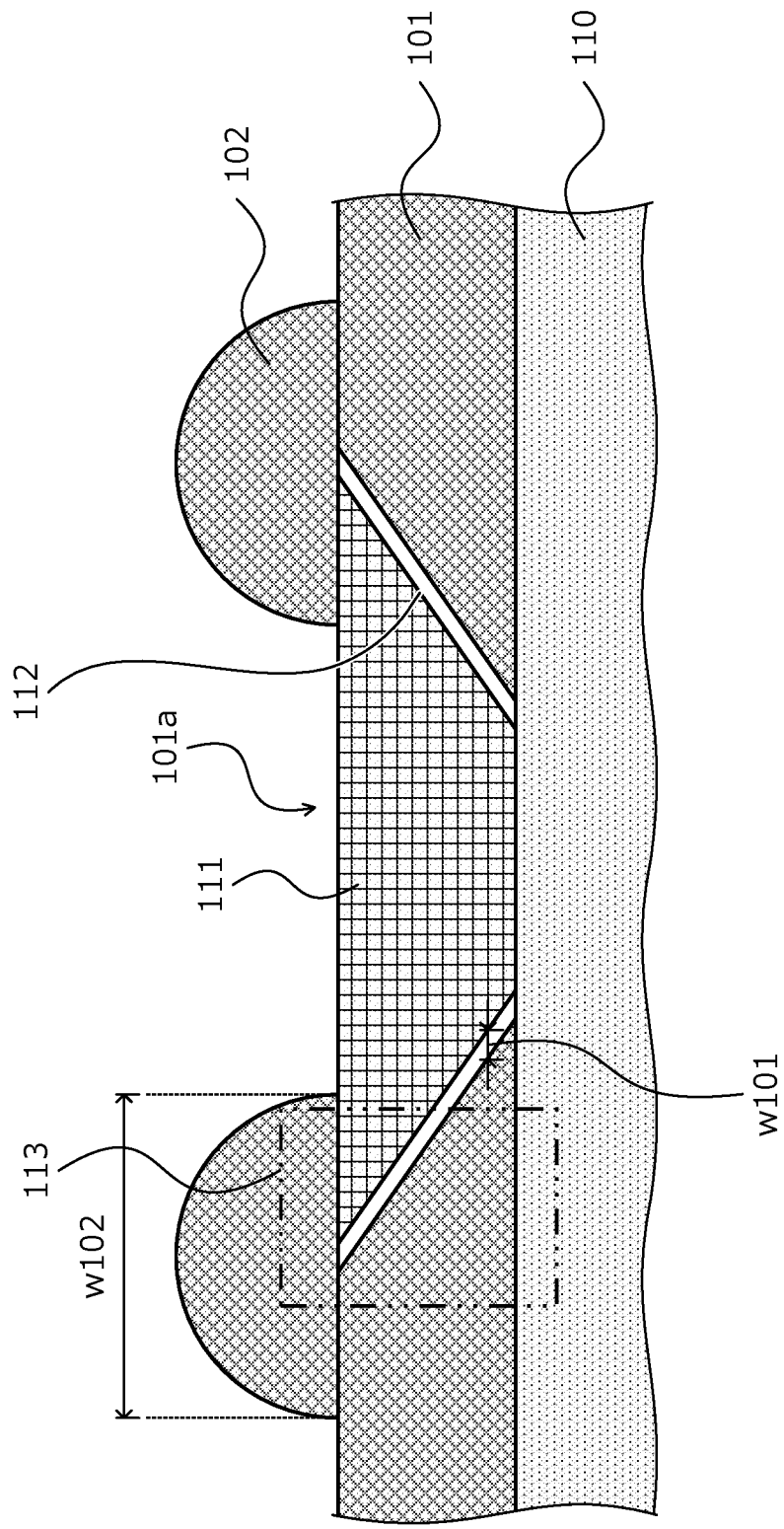
FIG. 10 is a cross-sectional view of main parts of a conventional semiconductor device.

Subsequently, at step S106, although a polyimide is applied by an inkjet method so as to span the gap 112 between the first protective film 101 and the plating film 111, the polyimide used at step S106 has a high viscosity and a low fluidity. Therefore, the second protective film 102 is formed so as to merely cover the opening of the gap 112 formed between the first protective film 101 and the plating film 111, and the gap 112 remains as it is after step S106 (refer to FIG. 8). FIG. 8 is a cross-sectional schematic view of the gap between the first protective film and the plating film when observed under a microscope. FIG. 8 corresponds to an enlarged view of a portion enclosed by a rectangular frame 113 in FIG. 10.

Further, due to thermal history of the testing at step S109 and the heat generation at the time of test operation of the semiconductor device, the width w101 of the gap 112 formed between the first protective film 101 and the plating film 111 may widen. In cases where the gap 112 forms between the first protective film 101 and the plating film 111, a large amount of air enters the gap 112 between the plating film 111 and the second protective film 102, whereby water contained in the air corrodes and deteriorates the plating film 111, giving rise to a problem of decreased reliability of the semiconductor device.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1:
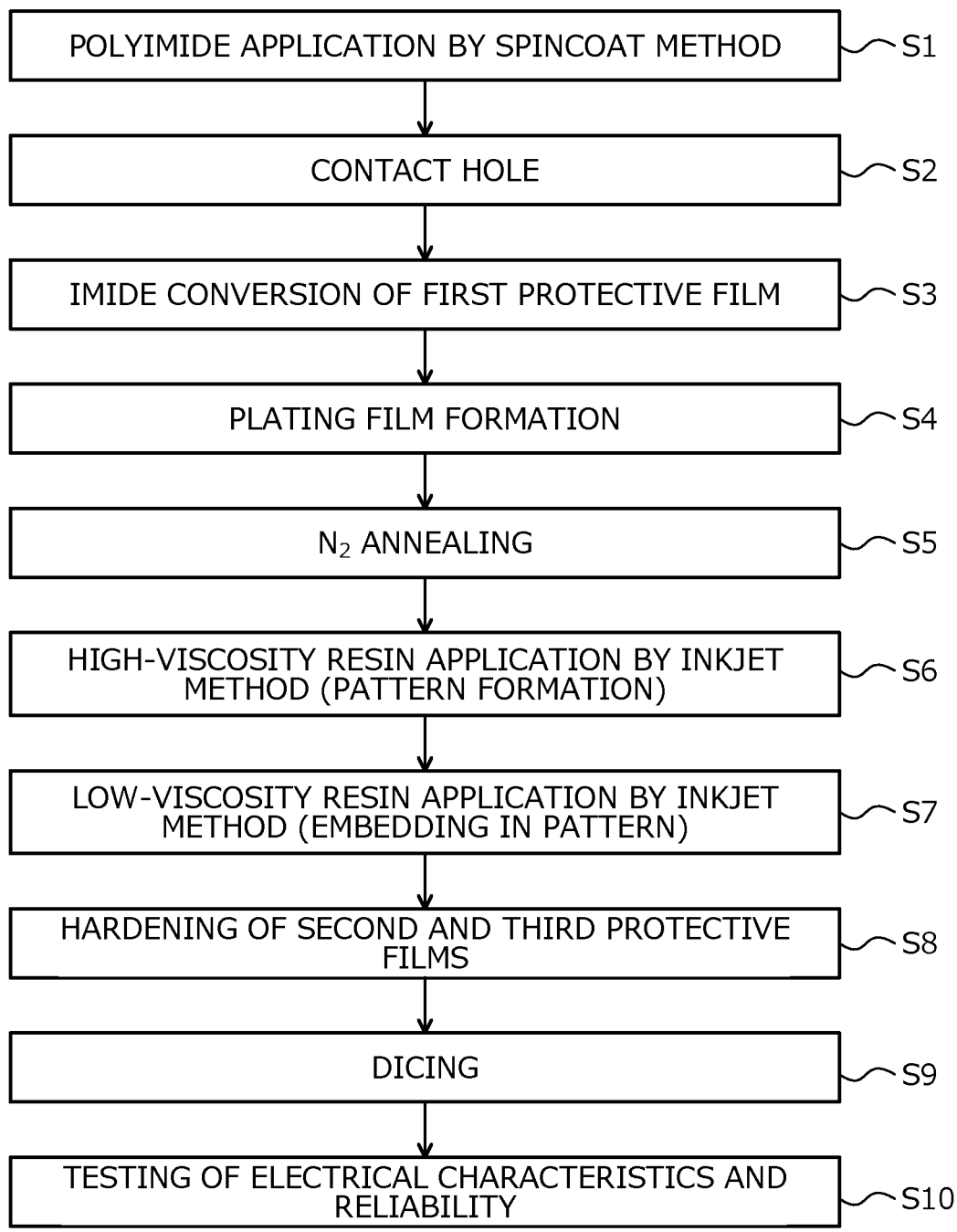
FIG. 1 is a flowchart depicting an outline of a method of manufacturing a semiconductor device according to a first embodiment.
Figure 2:
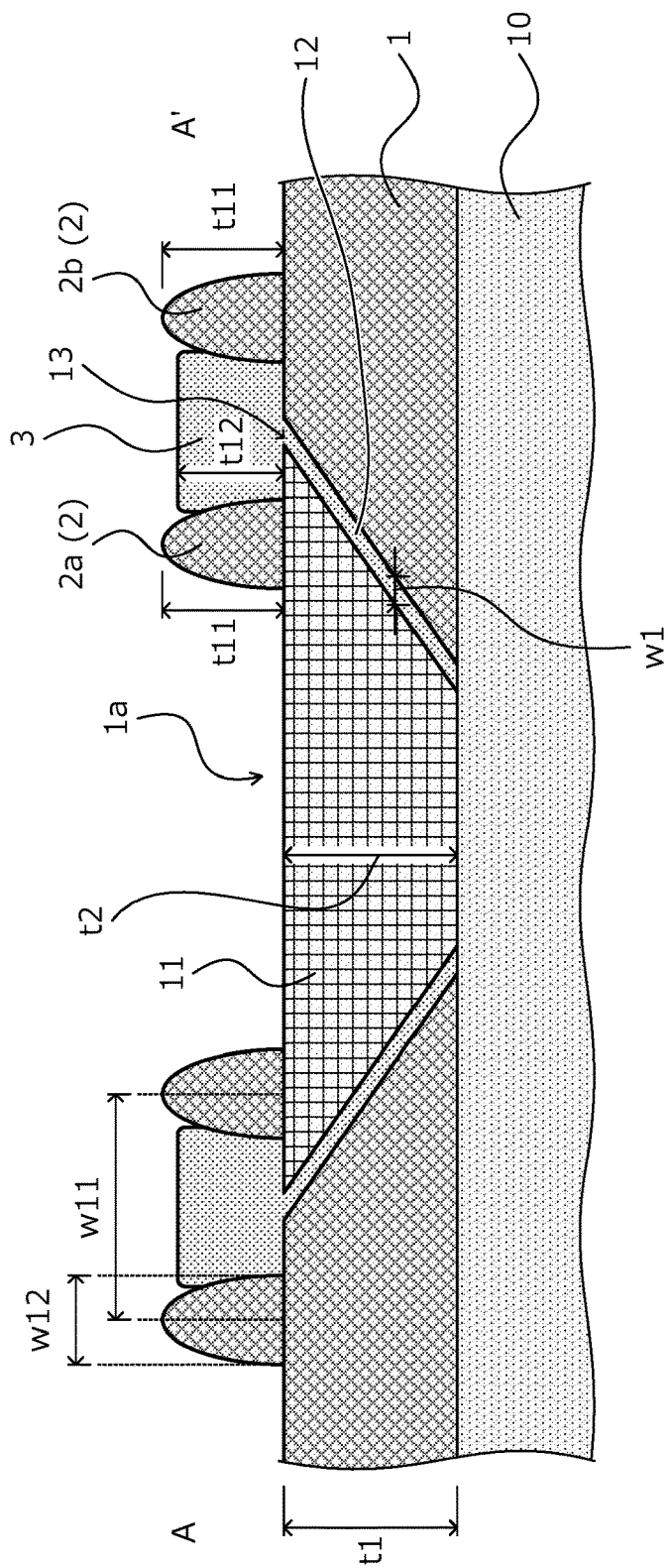
FIG. 2 is a cross-sectional view of main parts of the semiconductor device according to the first embodiment.
Figure 3:
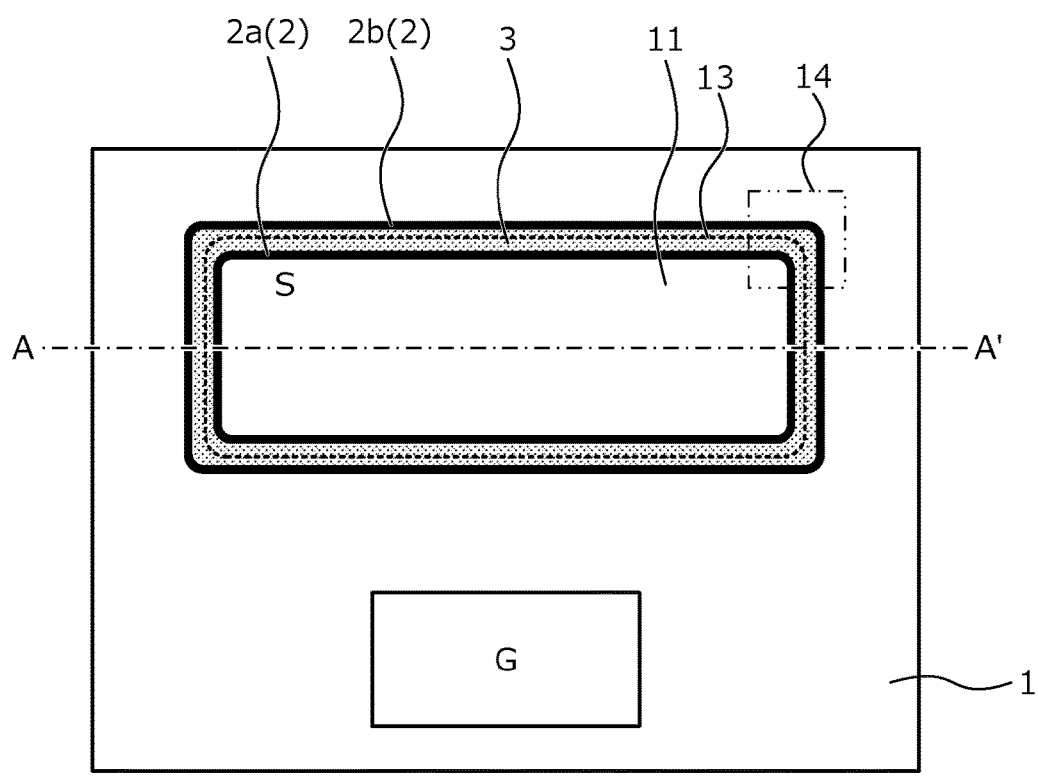
FIG. 3 is a plan view of a planar layout of the semiconductor device according to the first embodiment.
Figure 4:
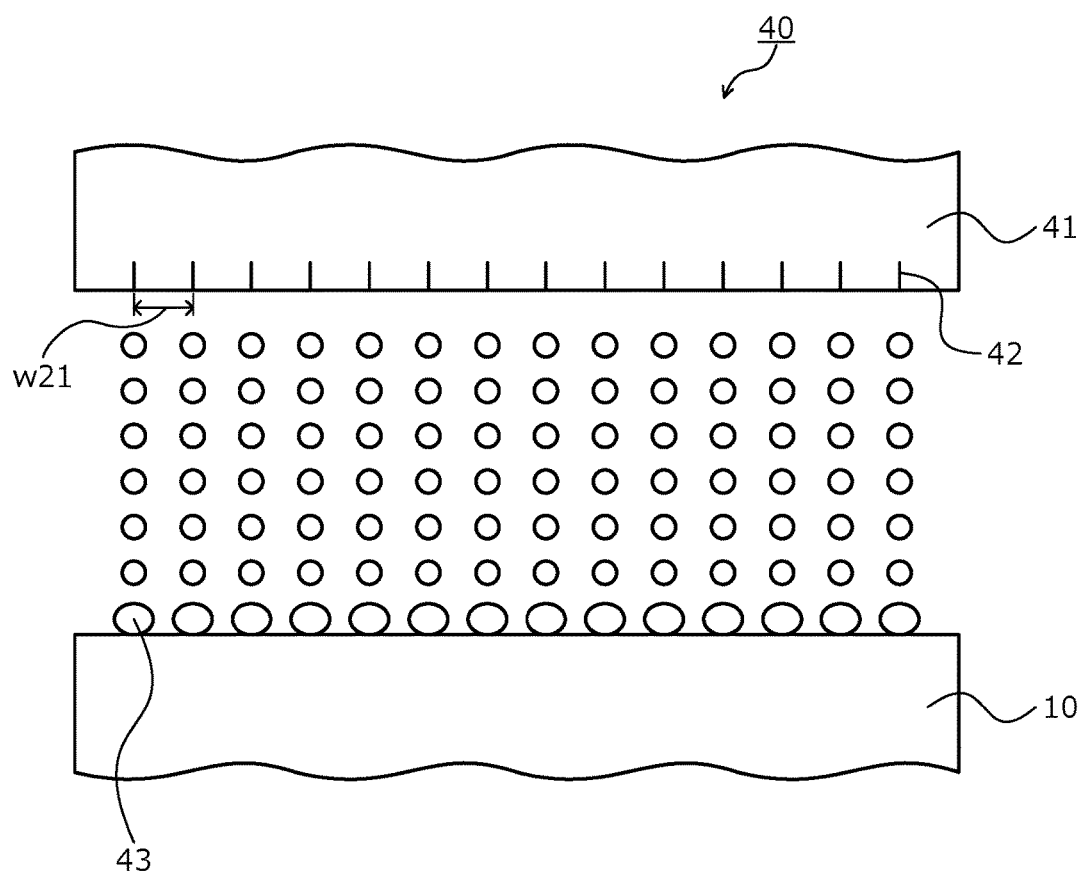
FIG. 4 is a schematic cross-sectional view of the state of an inkjet nozzle used at steps S6, S7 depicted in FIG. 1.

The method of manufacturing a semiconductor device according to a first embodiment will be described. FIG. 1 is a flowchart depicting an outline of the method of manufacturing a semiconductor device according to the first embodiment. FIG. 2 is a cross-sectional view of main parts of the semiconductor device according to the first embodiment. FIG. 2 depicts a cross-sectional view along cutting line A-A' depicted in FIG. 3. FIG. 3 is a plan view of a planar layout of the semiconductor device according to the first embodiment. FIG. 3 depicts one example of a planar layout of the electrode pad when a semiconductor substrate (hereinafter, silicon carbide substrate (semiconductor chip)) 20 containing silicon carbide (SiC) is used. A planar layout refers to a planar shape and arrangement configuration of components as viewed from a front surface side of the semiconductor chip. FIG. 4 is a schematic cross-sectional view of the state of an inkjet nozzle used at steps S6, S7 depicted in FIG. 1.

After semiconductor regions of predetermined device structures of the semiconductor device are formed on the semiconductor wafer, a front electrode (electrode layer) is formed on the front surface of the semiconductor wafer. In FIG. 2, the semiconductor wafer and the front electrode are collectively depicted as a single substrate unit 10. Next, after the semiconductor wafer is fixed to the rotary support stage of a coater (coating machine: not depicted), the semiconductor wafer being fixed with a rear surface thereof facing downward (facing toward the rotary support stage), a polyimide is applied to (dripped onto) the front surface of the semiconductor wafer from a nozzle (not depicted) of the coater. The semiconductor wafer is rotated, whereby the polyimide is spread by centrifugal force (spincoat method), forming as a passivation film, a polyimide film (hereinafter, first protective film) 1 on the entire front surface of the semiconductor wafer so as to cover the front electrode (step S1).

The thickness of the first protective film 1 is such that enables protection of the semiconductor chip and prevents impurities from entering from the outside; this thickness t1, for example, is about 10 μm to 12 μm. Normally, the thickness t1 of the first protective film 1 decreases exponentially according to increases of the rotational speed of the semiconductor wafer. Therefore, the viscosity of the polyimide used at step S1 is set to a viscosity that enables the predetermined thickness t1 of the first protective film 1 to be established according to the rotational speed [revolutions per minute (rpm)] of the semiconductor wafer and the type of solvent in the polyimide. Step S1 may be repeatedly performed 2 or more times to establish the predetermined thickness t1 of the first protective film 1.

A photoresist film (not depicted) having an opening that corresponds to a formation region of a contact (electrical contact portion) with metal wiring is formed on a surface of the first protective film 1 by photolithography and etching. Etching is performed using the photoresist film used as a mask to form a contact hole (opening) 1a in the first protective film 1 and partially expose the front electrode in the contact hole 1a (step S2). The photoresist film used as the etching mask is removed. Next, for example, the first protective film 1 is completely converted into an imide (hardened) by heat treatment at a temperature of about 300 degrees C. to 350 degrees C. (step S3).

The plating film 11 is formed on the front electrode exposed in the contact hole 1a (step S4). The plating film 11, for example, is formed so as to be embedded in the contact hole 1a. A thickness t2 of the plating film 11 is about the same as or less than the predetermined thickness t1 of the first protective film 1. The plating film 11, for example, may be a nickel phosphorus (Ni—P) plating film. Next, annealing (heat treatment) is performed in a nitrogen ($N_2$) atmosphere, whereby deposits (surface absorbate) on the surface (i.e., the surfaces of the first protective film 1 and the plating film 11) of the semiconductor wafer are removed (step S5). In the annealing at step S5, a gap 12 having a width w1 of about 0.5 μm at most may form at the boundary 13 between the first protective film 1 and the plating film 11.

Two patterns, first and second patterns 2a, 2b, along the boundary 13 between the first protective film 1 and the plating film 11 and extending in parallel, sandwiching the boundary 13 (the gap 12 in a case where the gap 12 forms between the first protective film 1 and the plating film 11), are formed by applying a high-viscosity resin by an inkjet method to form a high-viscosity resin film (hereinafter, second protective film) 2 as a passivation film (step S6). At this time, while the high-viscosity resin is applied on the semiconductor wafer, the applied high-viscosity resin, for example, may be heated at a temperature of about 40 degrees C. to cause solvent and/or water in the high-viscosity resin to evaporate. Thus, leakage and spreading of the high-viscosity resin applied on the semiconductor wafer is suppressed, enabling a width w12 of the first and second patterns 2a, 2b of the second protective film 2 to be adjusted.

The second protective film 2 includes the first pattern 2a arranged on the plating film 11 and the second pattern 2b arranged on the first protective film 1. The boundary 13 between the first protective film 1 and the plating film 11 is surrounded by the first and second patterns 2a, 2b so as to be sandwiched between the first and second patterns 2a, 2b of the second protective film 2. In FIG. 3, the first and second patterns 2a, 2b of the second protective film 2 are indicated by a bold line (similarly in FIG. 6). Further, a case is depicted in which the plating film 11 is formed covering a source electrode pad S of a metal oxide semiconductor field effect transistor (MOSFET). The source electrode pad S, for example, has a substantially rectangular planar shape. In this case, the second protective film 2 includes the first pattern 2a arranged on the plating film 11 in a substantially rectangular-shaped planar layout along an outer periphery of the plating film 11 (the source electrode pad S) and the second pattern 2b arranged on the first protective film 1 in a substantially rectangular-shaped planar layout along an inner periphery of the first protective film 1.

The first and second patterns 2a, 2b of the second protective film 2 are arranged to be separate from each other. Further, the first and second patterns 2a, 2b of the second protective film 2 are arranged so as to not narrow the width w1 of the gap 12 on the open side of the gap 12 between the first protective film 1 and the plating film 11. For example, although the first pattern 2a of the second protective film 2 may be arranged to be separate from the gap 12 between the first protective film 1 and the plating film 11, the farther inward the first pattern 2a is arranged on the plating film 11, the smaller the surface area of the plating film 11 becomes. Therefore, the first pattern 2a of the second protective film 2 may be arranged as near as possible to the gap 12 between the first protective film 1 and the plating film 11. The second pattern 2b of the second protective film 2 may be arranged to be separated from the gap 12 between the first protective film 1 and the plating film 11 in a range allowing the chip size.

In particular, the first and second patterns 2a, 2b of the second protective film 2, for example, have a cross-sectional shape that is an arc-shape protruding in a direction (upward) from the semiconductor wafer, or an elliptical arc-shape having a long axis as a height (thickness t11) protruding in a direction away from the semiconductor wafer. The width w11 between vertices of the first and second patterns 2a, 2b of the second protective film 2 may be about 200 µm to 300 µm. The wider the width w11 between vertices of the first and second patterns 2a, 2b of the second protective film 2 is, the more difficult it becomes for a third protective film 3 described hereinafter to leak and spread from between the first and second patterns 2a, 2b of the second protective film 2. The width w12 of the first and second patterns 2a, 2b of the second protective film 2 may be about 20 µm to 50 µm. The thickness t11 of the first and second patterns 2a, 2b of the second protective film 2 may be, for example, about 10 µm.

The high-viscosity resin used at step S6 is a polyimide (high-polymer compound including imide bonds) or a polybenzoxazole (photosensitive resist) and has a viscosity enabling application by an inkjet 40 (refer to FIG. 4). In particular, the viscosity of the high-viscosity resin used at step S6, for example, is 25 mPa·s (mili-Pascal seconds) or greater. In a nozzle 41 of the inkjet 40, for example, about 500 holes (nozzle holes) 42 that discharge a resin 43 are arranged in a comb-like shape. In FIG. 4, the nozzle holes 42 are indicated by vertical lines and the number thereof depicted is reduced for the sake of convenience. The diameter, arrangement, and arrangement interval w21 of the nozzle holes 42 are suitably set whereby the first and second patterns 2a, 2b of the second protective film 2 may be concurrently formed. The diameter and the arrangement interval w21 of the nozzle holes 42, for example, are about 10 µm. The width at the time of landing of the resin discharged from the nozzle holes 42 having a diameter of 10 µm (the width w12 of the first and second patterns 2a, 2b of the second protective film 2), for example, is about 20 µm to 50 µm.

A low-viscosity resin is applied between the first and second patterns 2a, 2b of the second protective film 2 by the inkjet method, forming as a passivation film, a low-viscosity resin film (hereinafter, third protective film) 3 (step S7). The low-viscosity resin is a polyimide or polybenzoxazole and the viscosity thereof is lower than the viscosity of the high-viscosity resin used at step S6 and, for example, is less than 25 mPa·s. The low-viscosity resin used at step S7 may be a resin having a same main constituent as that of the high-viscosity resin used at step S6. The reason for this is that adhesion of the second and third protective films 2, 3 may be improved.

The low-viscosity resin used at step S7 has a high fluidity. Therefore, at step S7, the low-viscosity resin applied between the first and second patterns 2a, 2b of the second protective film 2 leaks and spreads to the gap 12 between the first protective film 1 and the plating film 11. Therefore, the low-viscosity resin is applied between the first and second patterns 2a, 2b of the second protective film 2, for example, until a thickness t12 becomes about the same as the thickness t11 of the first and second patterns 2a, 2b of the second protective film 2 whereby the gap 12 between the first protective film 1 and the plating film 11 may be assuredly filled with the low-viscosity resin.

In other words, the third protective film 3 adheres to the first and second patterns 2a, 2b of the second protective film 2, and is formed across the boundary 13 between the first protective film 1 and the plating film 11. Additionally, the third protective film 3 is embedded in the gap 12 between the first protective film 1 and the plating film 11, whereby the gap 12 is plugged. In such a state, the third protective film 3 is formed and the thickness t12 of the third protective film 3 from the surfaces of the first protective film 1 and the plating film 11 is the thickness t11 of the first and second patterns 2a, 2b of the second protective film 2 or less.

At step S7, the first and second patterns 2a, 2b of the second protective film 2 function as a barrier that retains and prevents the low-viscosity resin from leaking and spreading outside from between the first and second patterns 2a, 2b of the second protective film 2. Further, while the low-viscosity resin is applied on the semiconductor wafer, the applied low-viscosity resin, for example, is heated at a temperature of about 40 degrees C. to evaporate solvent and water in the low-viscosity resin, enabling the leaking and spreading of the low-viscosity resin from the first and second patterns 2a, 2b of the second protective film 2 to the outside to be suppressed.

Further, the process at step S7 may be repeatedly performed two more times and the viscosity of the low-viscosity resin may be changed for each session of the process at step S7. For example, when step S7 is repeatedly performed three or more times, a low-viscosity resin is used in the first application at step S7 and in the third and subsequent applications, a low-viscosity resin having a higher viscosity than that of the first application is used. Further, when step S7 is repeatedly performed two times, a low-viscosity resin is used in the first application at step S7 and a low-viscosity resin having a higher viscosity that than of the first application is used in the second application at step 7. As a result, the cross-sectional shape of the coating film is controlled, enabling the thickness of the coating film to be controlled. Among the low-viscosity resins used in the process at step S7, the low-viscosity resin having a higher viscosity than that of the first application may have a same viscosity as that of the high-viscosity resin used at step S6.

The second and third protective films 2, 3 are hardened by heat treatment (step S8). In particular, at step S8, when both the second and third protective films 2, 3 are polyimide films, for example, conversion of the polyimide films into an imide is advanced by heat treatment at a temperature of about 200 degrees C. to 400 degrees C. for about 30 minutes. When both the second and third protective films 2, 3 are polybenzoxazole films, for example, hardening of the polybenzoxazole films is advanced with heat treatment at a temperature of about 200 degrees C. to 400 degrees C. for about 30 minutes. Further, when one of the second and third protective films 2, 3 is a polyimide film and the other is a polybenzoxazole film, heat treatment for hardening is performed for each formation of the second and third protective films 2, 3.

The semiconductor wafer is cut (diced), forming individual chips (step S9). Subsequently, a metal wire is soldered to the plating film 11 and thereafter, testing of the electrical characteristics and reliability is performed whereby non-defective chips are separated out (step S10), completing the manufacture of the semiconductor device chips. At step S10, as a reliability test, for example, a thermal shock test that evaluates capability against rapid temperature changes may be performed.

Further, no gap between the first protective film 1 and the plating film 11 is again generated due to thermal history of the testing at step S10 and the heat generation at the time of test operation of the semiconductor device. The reason for this is that as described above, in the annealing at step S5, the gap 12 formed between the first protective film 1 and the plating film 11 is plugged and filled by the third protective film 3 at step S7. At step S10, even if the third protective film 3 peels from the plating film 11 and a gap is again formed between the plating film 11 and the third protective film 3, this gap is plugged by a part of the third protective film 3 on the plating film 11. Therefore, air does not enter from the gap between the plating film 11 and the third protective film 3.

In the method of manufacturing a semiconductor device according to the first embodiment, in a case where the plating film 11 is formed on a gate electrode pad G (refer to FIG. 3), similar to the source electrode pad S, the second and third protective films 2, 3 may be formed along an outer periphery of the gate electrode pad G.

As described, according to the first embodiment, the second protective film constituted by the first and second patterns surrounding the boundary of the first protective film 1 and the plating film is formed by an application of a high-viscosity resin by the inkjet method, and the third protective film is formed by one or more applications of a low-viscosity resin between the first and second patterns of the second protective film by the inkjet method. At this time, a low-viscosity resin having high fluidity is used in the formation of the third protective film, whereby a gap between the first protective film and the plating film may be assuredly plugged and filled by the low-viscosity resin applied between the first and second patterns of the second protective film. Further, the low-viscosity resin applied between the first and second patterns of the second protective film may be retained by the first and second patterns of the second protective film and therefore, does not flow outside (unintended region at design) from between the first and second patterns of the second protective film. Therefore, the second and third protective films may be formed in a pattern as designed. Further, a gap between the first protective film and the plating film may be assuredly filled by the third protective film and therefore, subsequently, even with the thermal history, no gap between the first protective film and the plating film is formed and even when a gap is formed, the gap is microscopic. Thus, a structure that deters exposure of the plating film to air and is resistant to degradation becomes possible, whereby reliability of the semiconductor device is improved.

When a typical spincoat method is used to apply resins of differing viscosities on a single semiconductor wafer, the resin application and patterning of the resin film by photolithography and etching are repeatedly performed as a single set of processes. Therefore, the number of processes increases, giving rise to a problem in that throughput decreases and cost increases. On the other hand, according to the first embodiment, resins of differing viscosities are applied by the inkjet method and therefore, patterning of a resin film becomes unnecessary, enabling resins of differing viscosities to be continuously applied. Therefore, increases in the number of processes are suppressed, whereby decreases in throughput and increases in cost may be suppressed.

Figure 5:
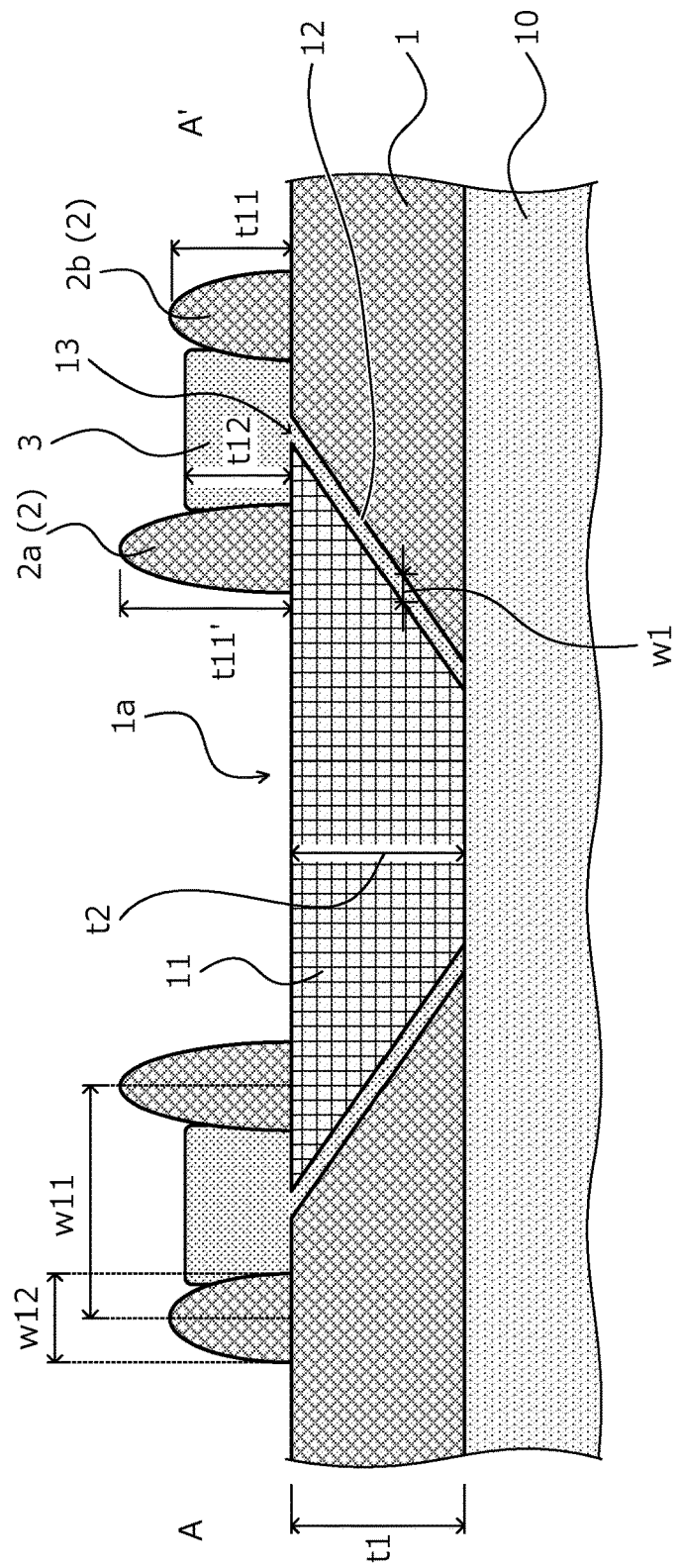
FIG. 5 is a cross-sectional view of main parts of the semiconductor device according to a second embodiment.

A structure of the semiconductor device according to a second embodiment will be described. FIG. 5 is a cross-sectional view of main parts of the semiconductor device according to the second embodiment. The semiconductor device according to the second embodiment differs from the semiconductor device according to the first embodiment in that a thickness t11' of the first pattern 2a of the second protective film 2, arranged on the plating film 11 is thicker than the thickness t11 of the second pattern 2b arranged on the first protective film 1 (t11<t11'). The thickness t11' of the first pattern 2a arranged on the plating film 11 may be increased at only a corner 14 (refer to FIG. 3) of the second protective film 2 arranged in a rectangular shaped planar layout and corresponding to each vertex of the rectangle.

In the method of manufacturing a semiconductor device according to the second embodiment, the first and second patterns 2a, 2b of the second protective film 2 are formed separately to have the differing thicknesses t11', t11, at step S6 (refer to FIG. 1) of the method of manufacturing a semiconductor device according to the first embodiment.

As described, according to the second embodiment, effects similar to those of the first embodiment may be obtained. Further, according to the second embodiment, at the time of application of the low-viscosity resin (i.e., process at step S7 in FIG. 1) for forming the third protective film, the low-viscosity resin may be further suppressed from leaking and spreading on the plating film.

Figure 6:
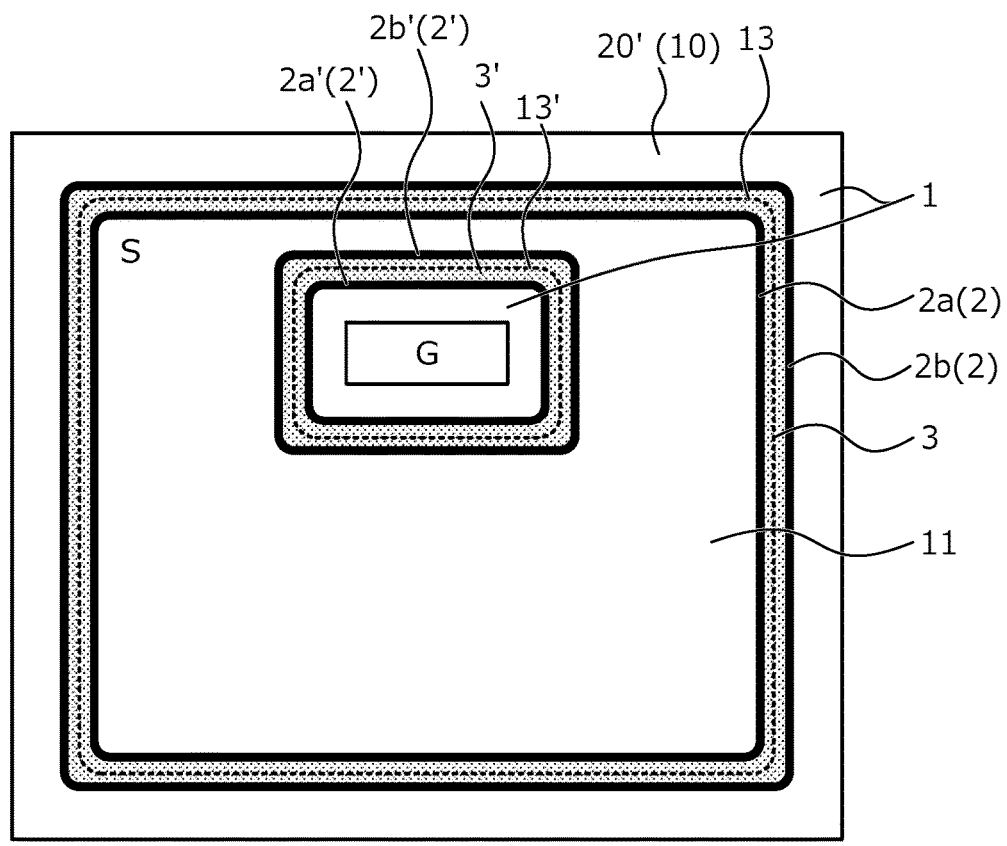
FIG. 6 is a cross-sectional view of main parts of the semiconductor device according to a third embodiment.

A structure of the semiconductor device according to a third embodiment will be described. FIG. 6 is a cross-sectional view of main parts of the semiconductor device according to the third embodiment. FIG. 6 depicts an example of the planar layout of the electrode pad in a case where a semiconductor substrate (hereinafter, silicon substrate (semiconductor chip)) 20' containing silicon (Si) is used. In the semiconductor device according to the third embodiment, the layouts of the source electrode pad S and the gate electrode pad G differ from those in the semiconductor device according to the first embodiment.

In particular, in the semiconductor device containing silicon, the source electrode pad S is arranged on a front surface of the silicon substrate 20', in a substantially rectangular planar shape surrounding a periphery of the gate electrode pad G. The second and third protective films 2, 3 are arranged in the periphery of the source electrode pad S, similar to the first embodiment. In an inner periphery of the source electrode pad S, similar to the second and third protective films 2, 3 in the outer periphery of the source electrode pad S, a second protective film 2' is formed by first and second patterns 2a', 2b' surrounding the boundary 13 between the first protective film 1 and a plating film 11', and a third protective film 3' is formed between the first and second patterns 2a', 2b'.

In the method of manufacturing a semiconductor device according to the third embodiment, the planar shape of the first and second patterns 2a, 2b of the second protective film 2 is suitably set at step S6 (refer to FIG. 1) of the method of manufacturing a semiconductor device according to the first embodiment.

The third embodiment may be applied to the second embodiment.

As described, according to the third embodiment, independent of the planar shape of the electrode pad, effects similar to those of the first and second embodiments may be obtained.

Figure 7:
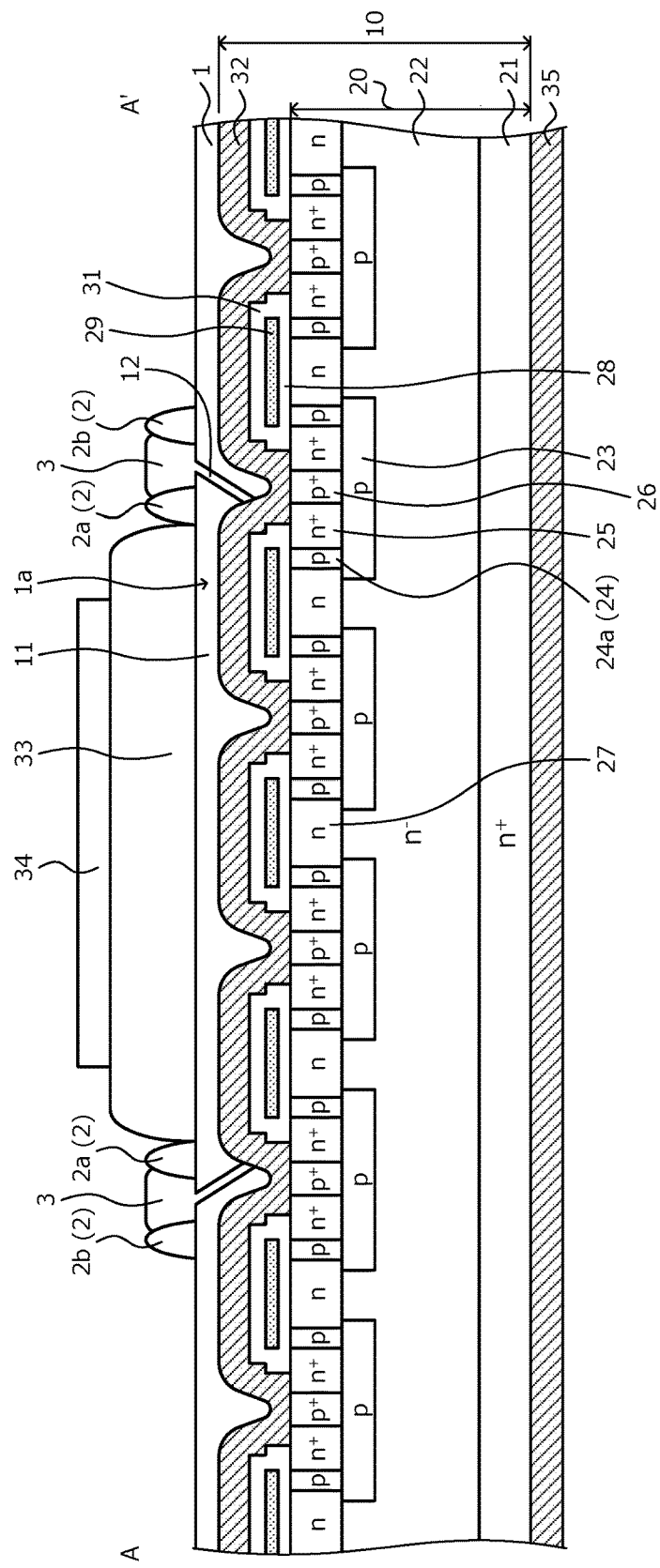
FIG. 7 is a cross-sectional view of an example of a structure of the semiconductor device according to a fourth embodiment.

In a fourth embodiment, an example of a semiconductor device to which the method of manufacturing a semiconductor device according to the first embodiment is applicable will be described. FIG. 7 is a cross-sectional view of an example of a structure of the semiconductor device according to the fourth embodiment. The semiconductor device according to the fourth embodiment is a MOSFET having an ordinary MOS gate on the front surface (surface on a p-type silicon carbide layer 24 side) side of the silicon carbide substrate (semiconductor chip) 20. The silicon carbide substrate 20 is an epitaxial substrate in which an n$^-$-type silicon carbide layer 22 and a p-type silicon carbide layer 24 are sequentially formed by epitaxial growth on a front surface of an n$^+$-type supporting substrate 21 containing silicon carbide.

In a surface layer on the p-type silicon carbide layer 24 side of the n$^-$-type silicon carbide layer 22, a p-type base region 23 is selectively provided. Portions of the n$^-$-type silicon carbide layer 22 other than the p-type base region 23 form an n$^-$-type drift region. An n$^+$-type source region 25 and a p$^+$-type contact region 26 are each selectively provided in the p-type silicon carbide layer 24 so as to face the p-type base regions 23 in a depth direction. The depth direction is a direction from the front surface of the silicon carbide substrate 20 toward a rear surface. The n$^+$-type source region 25 and the p$^+$-type contact region 26 may contact the p-type base region 23.

Further, in the p-type silicon carbide layer 24, an n-type JFET (Junction FET) region 27 is provided that penetrates the p-type silicon carbide layer 24 in the depth direction and reaches the n$^-$-type drift region (n$^-$-type silicon carbide layer 22). The n-type JFET region 27 is arranged separated from the n$^+$-type source region 25, on a first side of the n$^+$-type source region 25 opposite a second side thereof facing the p$^+$-type contact region 26. The n-type JFET region 27 has a function of reducing the JFET resistance. Portions of the p-type silicon carbide layer 24 other than the n$^+$-type source regions 25, p$^+$-type contact regions 26, and the n-type JFET regions 27 form a p-type base region 24a.

On the surface of each region of the p-type base region 24a between an n$^+$-type source region 25 and an n-type JFET region 27, a gate electrode 29 is provided via a gate insulating film 28. A source electrode 32 is provided on the front surface of the silicon carbide substrate 20 as a front electrode. The source electrode 32 contacts the n$^+$-type source region 25 and the p$^+$-type contact region 26 in a contact hole, and is electrically connected to the p-type base regions 23, 24a, the n$^+$-type source regions 25, and the p$^+$-type contact regions 26. Further, the source electrode 32 is electrically insulated from the gate electrode 29 by an interlayer insulating film 31.

The source electrode 32, for example, is a metal electrode layer containing nickel (Ni) as a main constituent. A barrier metal (not depicted) may be provided between the source electrode 32 and the interlayer insulating film 31. The barrier metal has a function of preventing the diffusion of metal atoms from the source electrode 32 toward the silicon carbide substrate 20 and the interlayer insulating film 31 and a function of preventing interaction between regions facing each other across the barrier metal. A portion from the source electrode 32 on the front surface of the silicon carbide substrate 20, to a drain electrode 35 described hereinafter on the rear surface of the silicon carbide substrate 20 corresponds to the substrate unit 10 (refer to FIG. 2) in the first embodiment. The first protective film 1 is provided on the source electrode 32 as a passivation film.

The source electrode 32 is partially exposed in the contact hole 1a of the first protective film 1. In the contact hole 1a of the first protective film 1, the plating film 11 is provided on the source electrode 32. The portion of the source electrode 32 covered by the plating film 11 constitutes a source electrode pad. For example, a terminal pin 34 is bonded to the plating film 11, via a solder layer 33, as metal wiring. The terminal pin 34 is bonded to the plating film 11 in an upright state substantially orthogonal to the substrate front surface (the front surface of the silicon carbide substrate 20). In FIG. 7, although depiction of the terminal pin 34 is simplified, in actuality, the terminal pin 34 having a rod-like shape is bonded to be vertically upright on the solder layer 33.

The terminal pin 34 is a wiring member having a round rod-like shape (cylindrical shape) and a predetermined diameter. The terminal pin 34 is a terminal (e.g., implant pin) for external connection to lead out potential of the source electrode 32. In place of the terminal pin 34, bonding wire or a lead pin may be soldered to the plating film 11. Portions other than the plating film 11 on the source electrode 32 are covered by the first protective film 1. The second and third protective films 2, 3 are provided similarly as described in the first embodiment. The drain electrode 35 contacts the rear surface (the rear surface of the n$^+$-type supporting substrate 21 constituting an n$^+$-type drain region) of the silicon carbide substrate 20. The drain electrode 35, for example, is a metal electrode layer containing aluminum (Al) as a main constituent.

As described, the fourth embodiment is applicable to the first to third embodiments.

Figure 11:
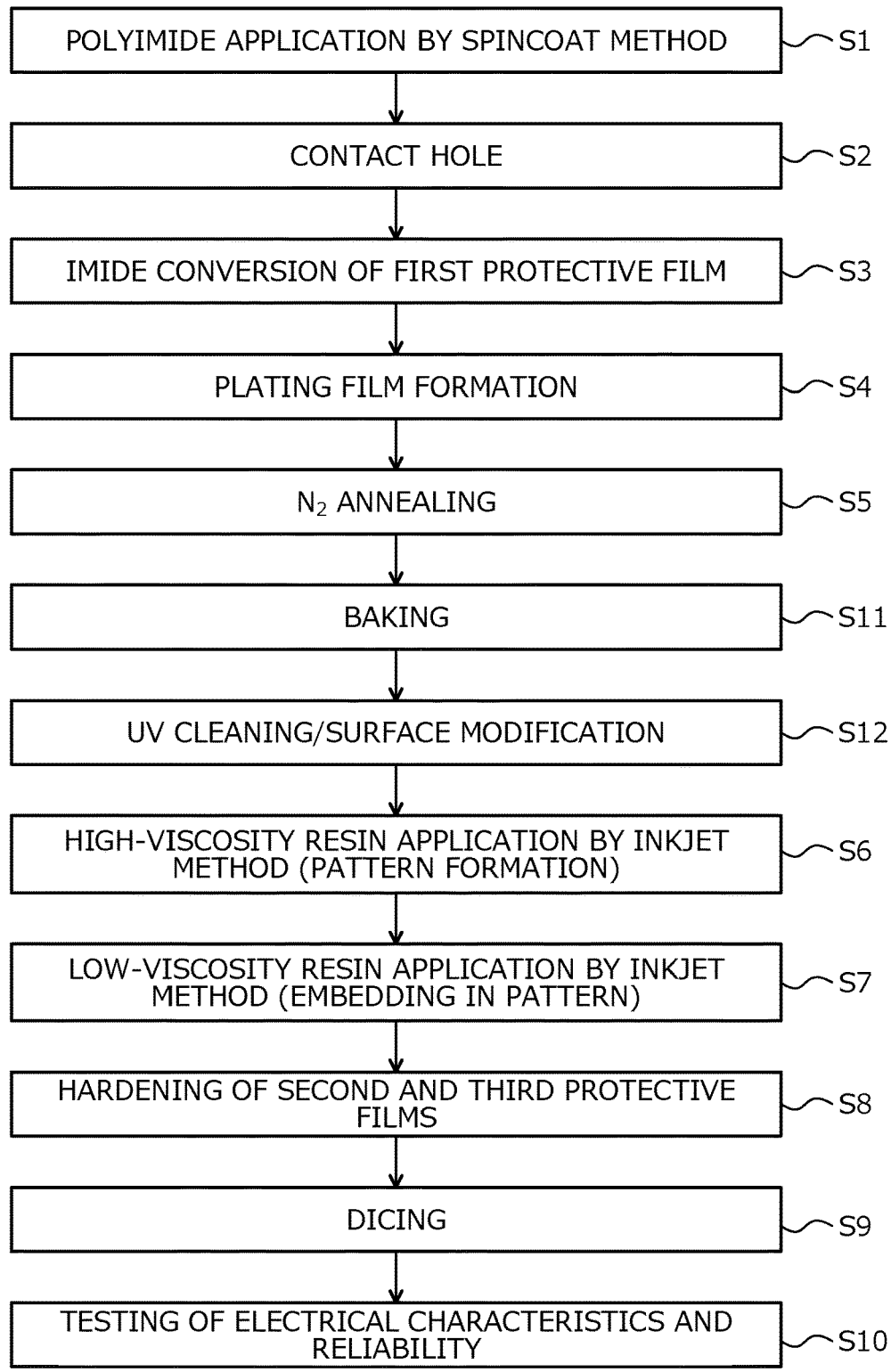
FIG. 11 is a flowchart depicting an outline of the method of manufacturing a semiconductor device according to a fifth embodiment.

The method of manufacturing a semiconductor device according to a fifth embodiment will be described with reference to FIGS. 2, 3, and 11. FIG. 11 is a flowchart depicting an outline of the method of manufacturing a semiconductor device according to the fifth embodiment. The method of manufacturing a semiconductor device according to the fifth embodiment differs from the method of manufacturing a semiconductor device according to the first embodiment in that after the process (annealing in nitrogen atmosphere) at step S5 and before the process (application of high-viscosity resin) at step S6, surface modification of the surface (surfaces of the first protective film 1 and the plating film 11) to which the high-viscosity resin is applied is performed by ultraviolet (UV) cleaning under an oxygen ($O_2$) atmosphere.

In particular, similar to the first embodiment, after semiconductor regions of predetermined device structures of semiconductor elements are formed on the semiconductor wafer and a front electrode (electrode layer) is formed on the front surface of the semiconductor wafer, from the process (formation of the first protective film 1 by polyimide application) at step S1 to the process (annealing in a nitrogen atmosphere) at step S5 are sequentially performed. Next, for example, mainly moisture ($H_2O$) contained in components (front electrode, the first protective film 1, the plating film 11, etc.) on the front surface of the semiconductor wafer is evaporated by baking (heat treatment) at a temperature of about 80 degrees C. for about 5 minutes (step S11). The process at step S11 may be omitted.

Next, UV light is irradiated under an oxygen atmosphere whereby surface cleaning and surface modification of the first protective film 1 and the plating film 11 is performed, removing organic matter on the surfaces of the first protective film 1 and the plating film 11 (step S12). In particular, at step S12, bonds of the organic matter on the surfaces of the first protective film 1 and the plating film 11 are broken by the UV light. The organic matter forms bonds with reactive oxygen species decomposed from ozone ($O_3$) generated in the oxygen atmosphere by the UV light, is converted into volatile substances such as carbon dioxide ($CO_2$), exhausted, and thereby removed.

Additionally, at step S12, bonds of molecular chains of the organic matter on the surface of the first protective film 1 and the plating film 11 are broken by collisions with the reactive oxygen species generated by the UV light. The resulting molecules of organic matter are caused to react with the reactive oxygen species whereby functional groups (hydroxyl group (—OH), aldehyde group (—CHO), carboxyl group (—COOH), etc.) are newly generated and the organic matter is removed. In this manner, the hydrophobic organic matter present on the surfaces of the first protective film 1 and the plating film 11 is decomposed and replaced with hydrophilic functional groups, whereby the surfaces of the first protective film 1 and the plating film 11 are modified to be hydrophilic.

In other words, at step S12, on the surfaces of the first protective film 1 and the plating film 11, surface cleaning whereby the organic matter is converted into volatile substances and removed, and surface modification whereby the organic matter is replaced with functional groups are concurrently performed. Irradiation conditions for the UV light at step S12 may be, for example, where the amount of UV light may be about 6.0 mw/$cm^2$, the furnace temperature may be about 30 degrees C., the inflow flow ratio of nitrogen gas and oxygen gas may be within a range of about nitrogen gas:oxygen gas=1:0.2 to about nitrogen gas:oxygen gas=1:1, and the period of UV irradiation may be about 400 seconds to 800 seconds.

Next, similarly to the first embodiment, a high-viscosity resin is applied by the inkjet method to form the second protective film 2 having the first and second patterns 2a, 2b on the surfaces of the first protective film 1 and the plating film 11, respectively (step S6). In the application of the high-viscosity resin by the inkjet method, it is important for the first and second patterns 2a, 2b of the second protective film 2 to be applied with high precision. For example, when hydrophobic organic matter is excessively present on the surface on which the high-viscosity resin is to be applied, the applied high-viscosity resin is repelled by the hydrophobic organic matter, whereby the second protective film 2 may not be formed by the first and second patterns 2a, 2b as desired.

Thus, after the process at step S5 and before the process at step S6, the hydrophobic organic matter present on the surfaces of the first protective film 1 and the plating film 11 are replaced with a hydrophilic functional group by the UV irradiation at step S12. As a result, the wettability of the high-viscosity resin at the surfaces of the first protective film 1 and the plating film 11 may be improved. Therefore, deformation and peeling of the first and second patterns 2a, 2b of the second protective film 2 when the high-viscosity resin is repelled by the surfaces of the first protective film 1 and the plating film 11 may be suppressed. As a result, the first and second patterns 2a, 2b of the second protective film 2 may be applied with precision.

Thereafter, similarly to the first embodiment, the process (formation of the third protective film 3 by low-viscosity resin application) at step S7 to the process (testing of electrical characteristics and reliability) at step S10 are sequentially performed, whereby the semiconductor device chip is completed. The process (semiconductor wafer dicing) at step S9 may be performed after the process at step S5 and before the process at step S11. When the process at step S9 is performed after the process at step S5 and before the process at step S11, after the process at step S9, the processes at steps S11, S12, S6, S7, S8, and S10 are sequentially performed with respect to the semiconductor chips.

The fifth embodiment may be applied to the second and third embodiments. Further, the fourth embodiment may be applied to the fifth embodiment.

As described, according to the fifth embodiment, effects similar to those of the first embodiment may be obtained. Further, according to the fifth embodiment, an additional process of surface cleaning and surface modification of the first protective film and the plating film UV is performed before the first and second patterns of the second protective film are formed by the application of the high-viscosity resin by the inkjet method. As a result, the wettability of the surfaces of the first protective film and the plating film with respect to the high-viscosity resin may be improved compared to a case where equipment for processing such as plasma processing under a vacuum atmosphere is introduced. Further, improvement of the wettability of the surfaces of the first protective film and the plating film with respect to the high-viscosity resin enables the first and second patterns of the second protective film to be formed with high dimensional precision.

Figure 12:
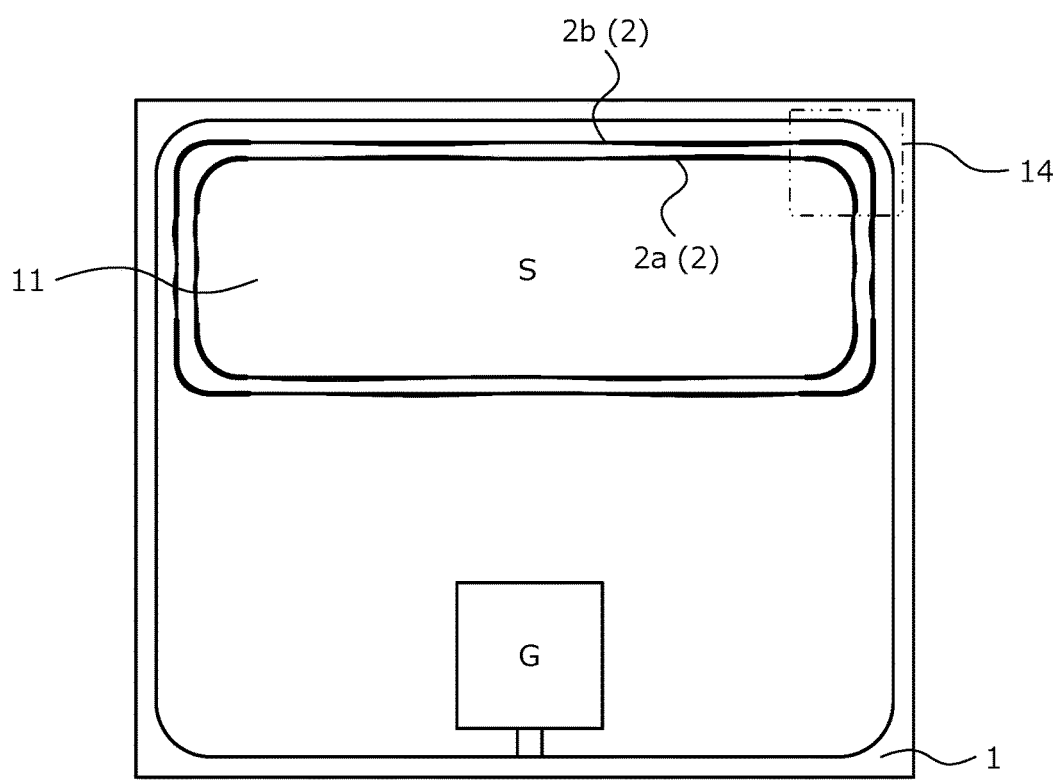
FIG. 12 is a schematic plan view of a planar layout of a semiconductor device according to EXAMPLE during manufacture.

Verification of the process (UV cleaning/surface modification) at step S12 of the method of manufacturing a semiconductor device according to the fifth embodiment was performed. FIG. 12 depicts, as viewed from the front surface side of the semiconductor substrate (semiconductor chip), the state of a sample (hereinafter, EXAMPLE) for which according to the method of manufacturing a semiconductor device according to the fifth embodiment (refer to FIGS. 2, 3, and 11), the processes from step S1 through steps S5, S11, and S12 to step S6 have been performed (i.e., up to formation the first and second patterns 2a, 2b of the second protective film 2). FIG. 12 is a schematic plan view of a planar layout of a semiconductor device according to EXAMPLE during manufacture.

In EXAMPLE, a semiconductor substrate containing silicon carbide was used and the source electrode pad S and the gate electrode pad G was arranged in the planar layout depicted in FIG. 3. In the process at step S4, a nickel (Ni)-phosphorus (P) plating film was formed as the plating film 11. In the process at step S11, the semiconductor substrate was baked at 80 degrees C. for 5 minutes. In the process at step S12, the amount of the UV light was 6.0 mw/$cm^2$, the temperature in the furnace was 30 degrees C., the UV irradiation period was 800 seconds, and the flow rates of the nitrogen gas and the oxygen gas into the furnace were each 3 L (liters)/minute (i.e., nitrogen gas:oxygen gas=1:1).

Figure 13:
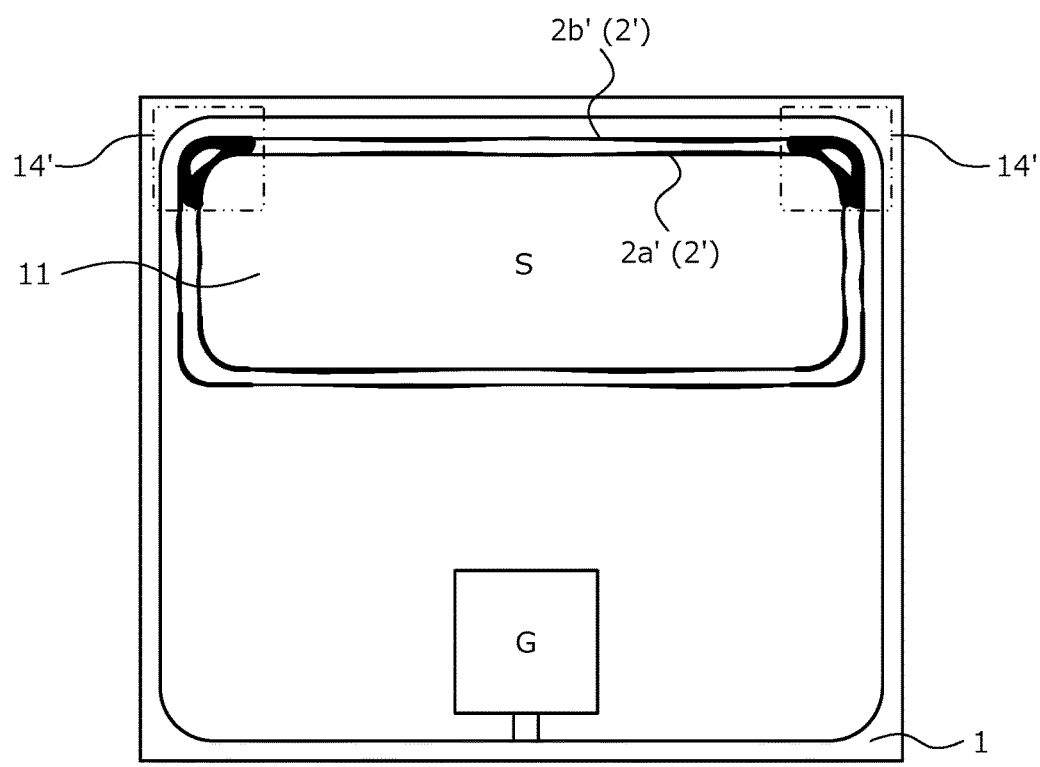
FIG. 13 is a schematic plan view of a semiconductor device that is a comparison example, during manufacture.

Further, for comparison, FIG. 13 depicts, as viewed from the front surface side of the semiconductor substrate (semiconductor chip), an example (hereinafter, comparison example) for which the processes up to step S6 in the method of manufacturing a semiconductor device according to the fifth embodiment have been performed omitting the process at step S12. FIG. 13 is a schematic plan view of a semiconductor device that is a comparison example, during manufacture. The comparison example was produced (manufactured) under the same conditions and by the same method as EXAMPLE except that the process (UV cleaning/surface modification) at step S12 was not performed.

From the results depicted in FIG. 13, in the comparison example, it was confirmed that the first and second patterns 2a', 2b' of the second protective film 2' were deformed and could not be formed in a predetermined pattern. The reason for this was that in the process (annealing in a nitrogen atmosphere) at step S5 and the process (baking performed relatively just before the high-viscosity resin application) at step S11, organic matter on the surfaces of the first protective film 1 and the plating film 11 is not completely removed whereby the high-viscosity resin is repelled by the residual organic matter on the surfaces of the first protective film 1 and the plating film 11. Although FIG. 13 schematically depicts only one sample of the comparison example, among the comparison examples, in many of the samples, the first and second patterns 2a', 2b' were partially continuous with each other (particularly at the corner 14' corresponding to each vertex of the rectangular shape).

On the other hand, from the results depicted in FIG. 12, in EXAMPLE, the first and second patterns 2a, 2b of the second protective film 2 could be formed in a predetermined pattern with high dimensional precision. The reason for this is that by the process at step S12, organic matter on the surfaces of the first protective film 1 and the plating film 11 is substantially removed and the wettability of the high-viscosity resin at the surfaces of the first protective film 1 and the plating film 11 was improved. Although FIG. 12 schematically depicts only one sample of EXAMPLE and, among EXAMPLEs, in some samples, the width w12 of the first and second patterns 2a, 2b of the second protective film 2 partially widened (particularly at the corner 14' corresponding to each vertex of the rectangular shape), in none of the samples of EXAMPLE were the first and second patterns 2a, 2b of the second protective film 2 formed to be continuous with each other.

The present invention is not limited to the embodiments described above and various modifications are possible within a scope not deviating from the spirit of the invention. For example, in the first to the third embodiments, the semiconductor wafer dicing (process at step S9) may be performed after annealing in a nitrogen atmosphere (process at step S5) and before the high-viscosity resin application (process at step S6). In the described embodiments, although a case has been described where the source electrode pad has a rectangular planar shape, the planar shape of the source electrode pad may be variously changed and may be a circular or elliptical shape, a rectangular shape having rounded corners, etc. In a case where the source electrode pad has a rectangular shape with rounded corners as a planar shape, in the second embodiment, with respect to the second protective film, the thickness of the first pattern arranged on the plating film may be increased at only the curved portions of the rectangular shape.

Further, the present invention is applicable even in a case where other than the plating film, an electrode film (conductive film having a thermal expansion coefficient different from that of the first protective film) is formed in the contact hole of the first protective film, and similar effects are achieved. The present invention is further applicable to other devices such as insulated gate bipolar transistors (IGBTs) and diodes. Other than silicon carbide, for example, other semiconductor materials having a wider bandgap than that of silicon such as gallium nitride (GaN) may be used in the present invention. The present invention is similarly implemented when the conductivity types (n-type, p-type) are reversed.

According to the embodiments, in the formation of the third protective film, a third resin having a high fluidity is used, whereby a gap between the first protective film and the electrode film may be assuredly plugged and filled by the third resin applied between the two second protective films. Further, the third resin applied between the two second protective films may be retained by the two second protective films and therefore, the third resin does not flow outside the two second protective films. Thus, the second and third protective films may be formed in a pattern as designed. Further, since a gap between the first protective film and the electrode film may be assuredly filled by the third protective film, subsequently, even with thermal history, no gap between the first protective film and the electrode film forms or even when a gap forms, the gap is minute. Therefore, the electrode film is not exposed to air and is resistant to degradation.

The semiconductor device and the method of manufacturing a semiconductor device according to the present invention achieve effects in that reliability may be improved.

As described, the semiconductor device and the method of manufacturing a semiconductor device according to the present invention is useful for semiconductor devices having an electrode film embedded in a contact hole of a passivation film.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a semiconductor device, the method comprising:
   forming a semiconductor device on a semiconductor wafer;
   forming an electrode layer on a first main surface of the semiconductor wafer, the electrode layer being electrically connected to the semiconductor device;
   forming a first protective film on the first main surface of the semiconductor wafer, the first protective film containing a first resin and having an opening that partially exposes the electrode layer;
   forming an electrode film on a surface of the electrode layer exposed in the opening;
   selectively applying a second resin on surfaces of the first protective film and the electrode film by an inkjet method so as to form, along a boundary between the first protective film and the electrode film, two second protective films that extend parallel to the boundary, one of the second protective films being formed on a first side of the boundary and the other second protective film being formed on an opposite side of the boundary, and applying a third resin between the two second protective films by the inkjet method so as to form a third protective film in contact with the two second protective films, a viscosity of the third resin being lower than a viscosity of the second resin.

2. The method according to claim 1, wherein the third resin is embedded in a gap between the first protective film and the electrode film so as to plug the gap, the gap being formed by heat treatment performed prior to applying the third resin.

3. The method according to claim 2, wherein the third resin is applied between the two second protective films two or more times so as to plug the gap.

4. The method according to claim 1, wherein of the two second protective films, a first second-protective-film is formed on the electrode film, along a contour of the electrode film, and a second second-protective-film is formed on the first protective film, along the contour of the electrode film.

5. The method according to claim 4, wherein a thickness of the first second-protective-film formed on the electrode film is thicker than a thickness of the second second-protective-film formed on the first protective film.

6. The method according to claim 1, wherein a viscosity of the second resin is 25 mPa·s or higher.

7. The method according to claim 1, wherein the viscosity of the third resin is lower than 25 mPa·s.

8. The method according to claim 1, wherein the second resin is a polyimide or polybenzoxazole.

9. The method according to claim 1, wherein the third resin is a polyimide or polybenzoxazole.

10. The method according to claim 1 further comprising:
removing organic matter on the surfaces of the first protective film and the electrode film after forming the electrode film and before applying the second resin.

11. The method according to claim 10, wherein the organic matter is removed by breaking bonds of the organic matter and converting the organic matter into a volatile substance.

12. The method according to claim 10, wherein the organic matter is removed by replacing the organic matter with a functional group.

13. The method according to claim 10, wherein the organic matter is removed by ultraviolet light irradiation in an oxygen atmosphere.

* * * * *